(12) United States Patent
Pavier (10) Patent No.: US 7,345,563 B2
(45) Date of Patent: Mar. 18, 2008

(54) EMBEDDED INDUCTOR FOR SEMICONDUCTOR DEVICE CIRCUIT (75) Inventor: Mark Pavier, Felbridge (GB)

(73) Assignee: International Rectifier Corporation, El Segundo, CA (US)

( * ) Notice: Subject to any disclaimer, the term of this patent is extended or adjusted under 35 U.S.C. 154(b) by 156 days.

(21) Appl. No.: 11/375,483

(22) Filed: Mar. 14, 2006

(65) Prior Publication Data
US 2006/0152323 A1 Jul. 13, 2006

Related U.S. Application Data (63) Continuation of application No. 10/246,151, filed on Sep. 17, 2002, now abandoned.

(60) Provisional application No. 60/323,568, filed on Sep. 19, 2001.

(51) Int. Cl.
H01F 5/00 (2006.01)
(52) U.S. Cl. .................................................. 336/200
(58) Field of Classification Search ................. 336/65, 336/83, 200, 206–208, 220–223, 232; 361/760–766; 257/531
See application file for complete search history.

(56) References Cited

U.S. PATENT DOCUMENTS

| 4,201,965 | A | 5/1980 | Onsyhkevych |
| 4,322,698 | A | 3/1982 | Takahashi et al. |
| 4,392,013 | A | 7/1983 | Ohmura et al. |
| 4,731,297 | A | 3/1988 | Takaya |
| 4,959,631 | A * | 9/1990 | Hasegawa et al. ............ 336/83 |
| 5,062,197 | A | 11/1991 | Ngo et al. |
| 5,095,357 | A | 3/1992 | Andoh et al. |
| 5,312,674 | A * | 5/1994 | Haertling et al. ........... 428/210 |
| 5,515,022 | A * | 5/1996 | Tashiro et al. .............. 336/200 |
| 5,565,837 | A | 10/1996 | Godek et al. |
| 5,583,474 | A | 12/1996 | Mizoguchi et al. |
| 5,777,539 | A | 7/1998 | Folker et al. |
| 6,008,714 | A | 12/1999 | Okuda et al. |
| 6,073,339 | A | 6/2000 | Levin |
| 6,120,916 | A | 9/2000 | Delvinquier et al. |
| 6,124,778 | A | 9/2000 | Rowley et al. |
| 6,124,779 | A | 9/2000 | Yamamoto |
| 6,137,389 | A | 10/2000 | Uchikoba |
| 6,144,276 | A | 11/2000 | Booth |
| 6,201,286 | B1 | 3/2001 | Nagasaka |
| 6,246,311 | B1 | 6/2001 | Finnemore et al. |
| 6,275,132 | B1 | 8/2001 | Shikama et al. |
| 6,293,001 | B1 | 9/2001 | Uriu et al. |
| 6,593,841 | B1 * | 7/2003 | Mizoguchi et al. ......... 336/200 |
| 6,650,529 | B1 | 11/2003 | Murata et al. |
| 6,768,409 | B2 | 7/2004 | Inoue et al. |
| 7,271,693 | B2 * | 9/2007 | Ding et al. ................. 336/200 |

FOREIGN PATENT DOCUMENTS

JP 11219821 8/1999

* cited by examiner

Primary Examiner—Tuyen T. Nguyen (57) ABSTRACT

An embedded inductor which includes a spiral conductive inductor embedded in a magnetically permeable body composed of particles of pre-sintered magnetically permeable (e.g. ferromagnetic) material and an epoxy binder.

12 Claims, 6 Drawing Sheets

FIG. 19 Inductance versus total coil area
(test structure order 6 < 3 < 5 < 2 < 4 < 1)

FIG. 20

Series resistance of spiral coils versus test structure number for ferrite loaded pastes

EMBEDDED INDUCTOR FOR SEMICONDUCTOR DEVICE CIRCUIT

RELATED APPLICATION

This application is a continuation of U.S. application Ser. No. 10/246,151, filed Sep. 17, 2002, now abandoned by Mark Pavier, entitled Embedded Inductor for Semiconductor Device Circuit which is based on and claims priority to U.S. Provisional Application No. 60/323,568, filed on Sep. 19, 2001, by Mark Pavier, entitled "Embedded Inductor for Semiconductor Device Circuit," the subject matter and disclosure of which is incorporated by reference herein.

FIELD OF THE INVENTION

This invention relates to discrete electronic devices and more specifically to an inductor and process for the manufacturing thereof.

BACKGROUND OF THE INVENTION

Inductors are commonly required in small, low volume, low weight circuits such as buck converter circuits used for dc to dc converters. The conventional inductors used in such circuits are usually large and thus occupy considerable space on printed circuit boards. It would be desirable to manufacture inductors which can be easily integrated with semiconductor circuit devices such as MOSFETs, integrated circuits and other passive elements such as resistors and capacitors without using substantial printed circuit board area.

In the recent years, embedded inductors have been developed to address the need for having a small inductor. A well known structure for an embedded inductor is a spiral-shaped inductor embedded in a magnetically permeable material. Spiral shaped inductors embedded between substrate/pre-preg materials or permalloy loaded epoxies are examples of such known embedded inductors. Permalloy is a ferromagnetic material of high magnetic permeability which is responsible for increasing the device inductance.

Results from experiments drawn between spiral inductors embedded between substrate/pre-preg materials and those embedded between permalloy loaded epoxies have shown that coils surrounded by the permalloy loaded epoxy compounds have up to 10% higher inductance compared to coils surrounded by substrate/pre-preg materials. Thus, although permalloy could be used to reduce the size of the spiral inductor in an embedded inductor, the improvement in inductance is not significant.

It is, therefore, desirable to have an embedded inductor with improved inductance per unit area.

BRIEF DESCRIPTION OF THE INVENTION

The following are typical methods used to increase inductance per unit area:
 1) Winding inductor coils around pre-sintered ferrite cores;
 2) Using multiplayer tracks to increase the number of windings;
 3) Winding more copper wire turns around ferrite cores;
 4) Use of soft iron core laminates;
 5) Use of MetGlass type core materials.

The most common approaches to increasing inductance per unit area in wound components involves methods (1) and (3). It has been recognized by the inventors that one of the key processes in preparing the ferrite materials is the high temperature pre-sintering (calcining) stage which locks in the ferrite's physical spinel structure that provides the high permeability. Pre-sintering has not been carried out on the known permalloy soft ferrite materials, which the inventors believe is the reason for the relatively poor improvement in inductance of spiral inductors in permalloy.

In accordance with the present invention an embedded inductor includes a spiral inductor embedded in a magnetically permeable material comprising pre-sintered ferrite particle in an epoxy binder.

According to another aspect of the present invention an embedded inductor according to the present invention is manufactured according to a novel process which employs a spiral conductive inductor trace (of any desired number of turns) which is completely encapsulated in a magnetically permeable paste that includes particles of pre-sintered ferromagnetic material such as, for example, permalloy embedded in an epoxy binder.

To form the spiral inductor trace (or winding), a layer of conductive material such as copper or silver loaded epoxy is formed atop a thin layer of a magnetically permeable paste such as a paste comprising pre-sintered permalloy particles in an epoxy binder. The layer of conductive material can be formed by any appropriate method such as, for example, electroless, or shadow plating or screen printing.

In one process, for example, a copper "seed" layer is first deposited, and panel plating is used to increase the copper thickness which decreases the series resistance of the subsequently formed inductor winding. After the plating process, the copper is patterned to form the spiral inductor.

In another process, for example, the spiral inductor is formed by depositing and patterning a layer of conductive epoxy such as silver loaded epoxy.

After the formation of the spiral inductor, a second layer of magnetically permeable paste is formed on the top surface of the spiral pattern, and subsequently cured at a suitable temperature. The magnetically permeable paste may be formed over the spiral inductor by any known method such as screen printing.

A top layer of conductive material such as a copper laminate is then adhered to the top of the second layer of magnetically permeable paste. An additional bottom layer of conductive material may be formed below the first layer of magnetically permeable paste. The top and bottom conductive layers may then be connected to respective ends of the spiral inductor through respective vias and patterned to form top and bottom connection pads for the embedded inductor.

According to another aspect of the invention, the inductance per unit area may be increased by stacking additional layers of ferromagnetic paste and patterned spiral inductors, and connecting each spiral inductor in each layer in series with adjacent spiral inductors.

According to a further aspect of the invention, additional layers may be added to the embedded inductor, which layers may contain signal tracks, power planes, embedded resistors, other inductors, capacitors, and active components such as field effect transistors and integrated circuits. The resulting assembly can, therefore, form the basis of a totally packaged circuit module.

The present invention thus provides a novel low cost embedded inductor and process for its manufacture that is compatible with standard printed circuit board (PCB) manufacturing techniques.

Other features and advantages of the present invention will become apparent from the following description of the invention which refers to the accompanying drawings.

BRIEF DESCRIPTION OF THE PREFERRED EMBODIMENTS

Figure 1:
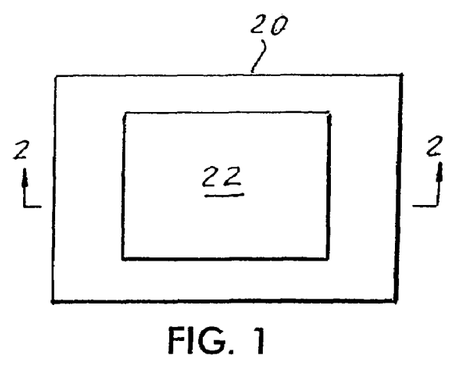
FIG. 1 is a top view of an initial substrate for the manufacture of an embedded inductor, with a ferromagnetic paste formed atop an insulation/conductive laminate.
Figure 2:
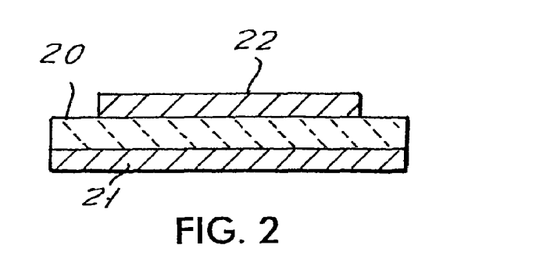
FIG. 2 is a cross-section of FIG. 1, taken across section line 2-2 in FIG. 1.

Referring first to FIGS. 1 and 2 there is shown a starting insulation printed circuit board (PCB) 20. PCB 20 may be an insulation laminate, such as BT or a ceramic, having a first conductive layer 21 on its bottom and a first magnetically permeable layer 22 on its top. The first magnetically permeable layer 22 may be comprised of a magnetically permeable paste composed of particles of a pre-sintered ferromagnetic material, such as pre-sintered permalloy particles, in an epoxy binder which cures at about 150° C. in about 30 minutes. Preferably, before curing, the magnetically permeable paste may be heated to about 80° C. to dry off the solvent. The first magnetically permeable layer 22 may be formed over PCB 20 by any suitable method such as, for example, screen printing.

Figure 3:
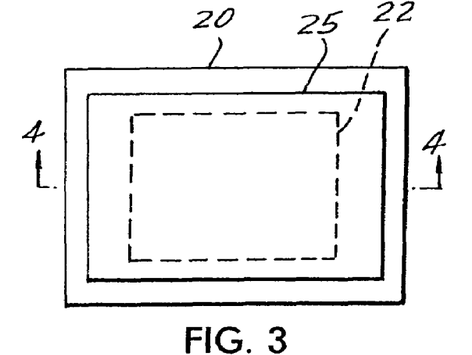
FIG. 3 is a top view like that of FIG. 1, after forming a copper layer on the top of the device.
Figure 4:
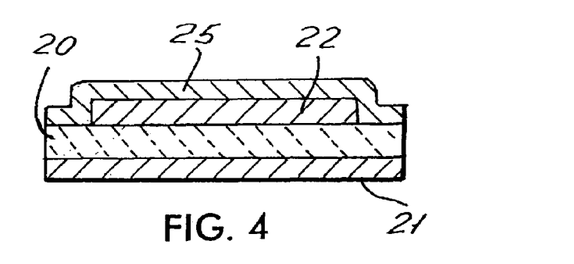
FIG. 4 is a cross-section of FIG. 3, taken across section line 4-4 in FIG. 3.

As shown in FIGS. 3 and 4, a layer of conductive material 25, such as copper, conductive epoxy or another suitable material, is formed atop the first magnetically permeable layer 22. The layer of conductive material 25 may be formed by any appropriate method such as shadow or electroless plating or screen printing. Also, any appropriate conventional process may be employed to increase the thickness of the layer of conductive material 25 in order to reduce the resistance of the spiral inductor (27, FIG. 5) that is to be formed by patterning the layer of conductive material 25. For example, if copper is used for forming the layer of conductive material 25, panel plating process may be employed to increase the thickness.

Figure 5:
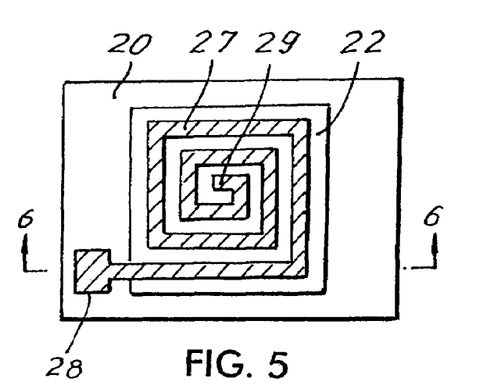
FIG. 5 is a top view like FIG. 3, after the patterning of the copper layer to define an inductor winding.
Figure 6:
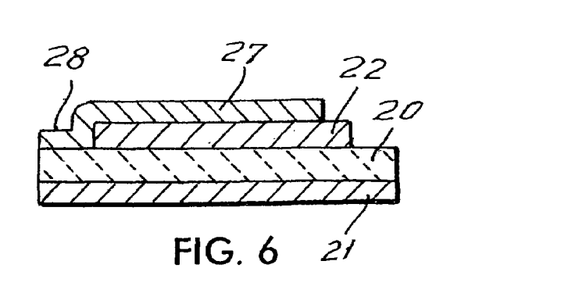
FIG. 6 is a cross-section of FIG. 5, taken across section line 6-6 in FIG. 5.

Thereafter, and as shown in FIGS. 5 and 6, the layer of conductive material 25 is patterned by any appropriate method to form a spiral inductor 27. The spiral inductor 27 can have any desired number of turns. Preferably, spiral inductor 27 is patterned to have enlarged ends to serve as terminals 28, 29.

Figure 7:
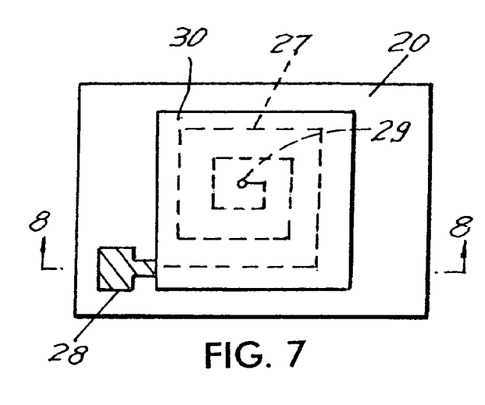
FIG. 7 is a top view like that of FIG. 5, after the addition of a further ferromagnetic paste layer atop the inductor winding traces.
Figure 8:
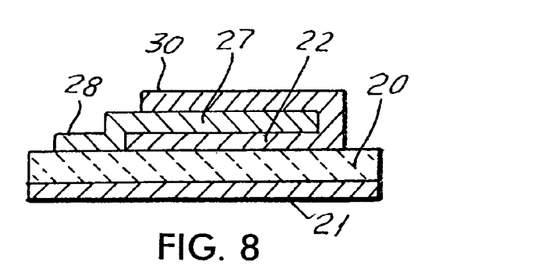
FIG. 8 is a cross-section of FIG. 7, taken across section line 8-8 in FIG. 7.

As next shown in FIGS. 7 and 8, a second magnetically permeable layer 30 is formed atop spiral inductor 27. The second magnetically permeable layer 30 may also be formed by any conventional method such as screen printing. The second magnetically permeable layer 30 is also comprised of a magnetically permeable paste composed of pre-sintered ferromagnetic particles such as permalloy embedded in an epoxy binder. Second magnetically permeable layer 30, like the magnetically permeable paste of first magnetically permeable layer 22, is also cured for about 30 minutes at 150° C. Preferably, before curing, the magnetically permeable paste may be first heated to about 80° C. to dry off the solvent. Thus, spiral inductor 27 is surrounded by a magnetically permeable body formed by the first and second magnetically permeable layers 22, 30, which combination exhibits a suitably high inductance per unit area.

According to an aspect of the present invention, additional layers of magnetically permeable material and spiral inductors may also be formed to produce a plurality of, for example, series connected embedded inductors.

Figure 9:
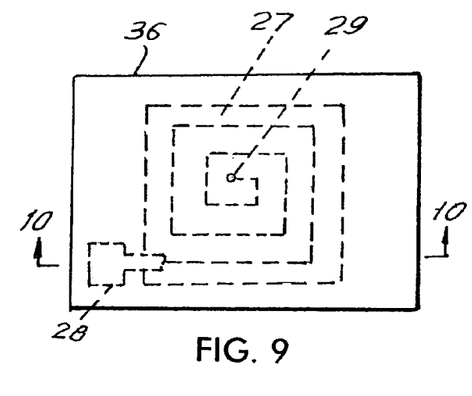
FIG. 9 is a top view like that of FIG. 7 after the laminating of an insulation layer and a further copper layer.
Figure 10:
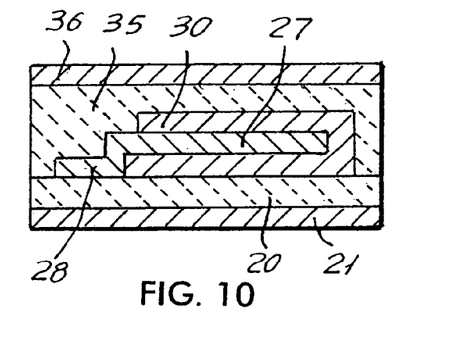
FIG. 10 is a cross-section of FIG. 9 taken across section line 10-10 in FIG. 9.

As next shown in FIGS. 9 and 10, a further insulation layer 35 and a second conductive layer 36 are laminated atop the structure of FIGS. 7 and 8 to totally encapsulate spiral inductor 27. The second conductive layer 36 may formed from any suitable conductor such as copper.

Figure 11:
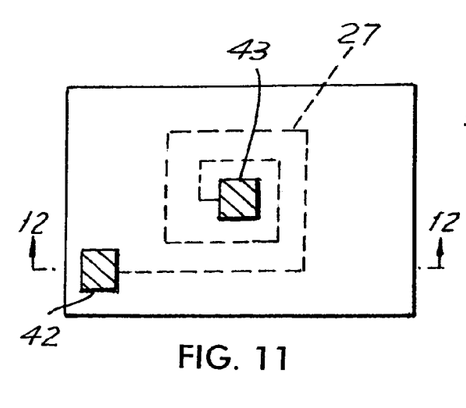
FIG. 11 is a top view like that of FIG. 9, after the formation of vias and the etching and formation of contacts for the ends of the embedded inductor.
Figure 12:
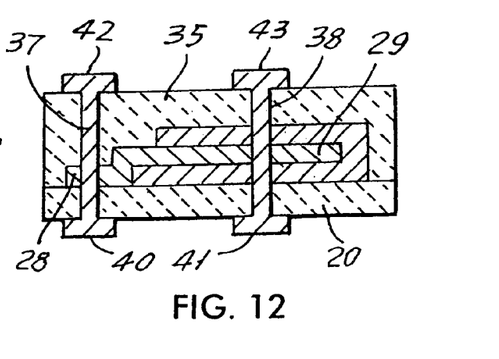
FIG. 12 is a cross-section of FIG. 11 taken across section line 12-12 in FIG. 11.

Finally, as shown in FIGS. 11 and 12, vias are formed by drilling holes through the assembly and through terminals 28 and 29. The vias are then plated with conductive post material 37 and 38 (FIG. 12). The first and second conductive layers 21 and 36 are etched to remove all material except for pads 40, 41 in the first conductive layer 21 and pads 42, 43 in the second conductive layer 36. Pads 40 and 42 are connected by plated post 37 to terminal 28 and pads 41 and 43 are connected by plated post 38 to terminal 29.

Thus, the process described forms a novel embedded inductor having pad connectors for connection to other components. For example, with the appropriate placement of pad terminals and interconnects through insulation 35, numerous circuits can be built on the structure of FIGS. 11 and 12.

Figure 13:
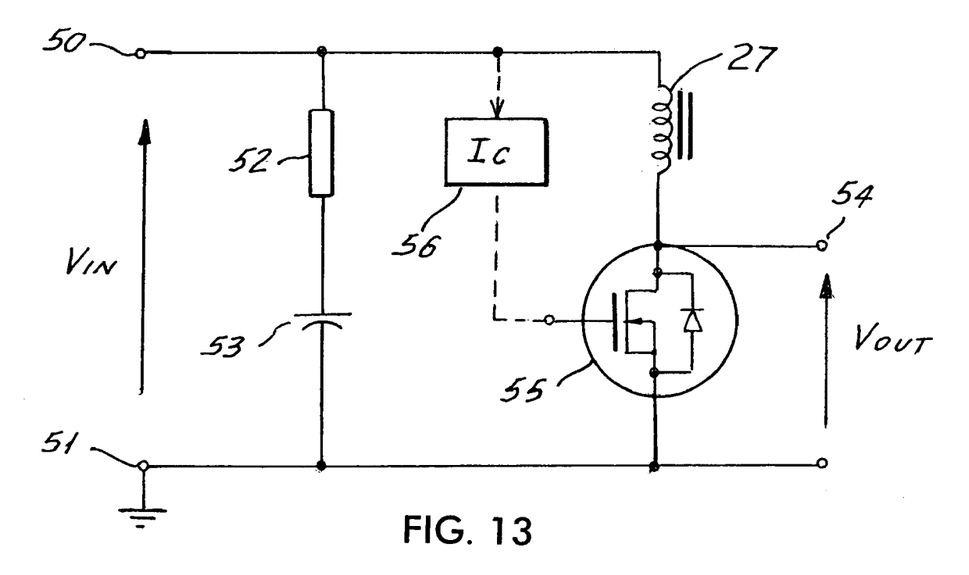
FIG. 13 is a circuit diagram of a circuit in which the inductor of FIGS. 11 and 12 may be employed.

FIG. 13 shows a typical dc to dc converter in which an input voltage $V_{IN}$ between terminal 50 and 51 (ground) is applied across resistor 52 and capacitor 53 and across inductor 27 and MOSFET 55 with inductor 27 in series with the drain and source terminals of MOSFET 55. The MOSFET 55 is controlled by a suitable IC 56 to produce a highly controlled output voltage $V_{OUT}$ between terminal 54 and 51.

Figure 14:
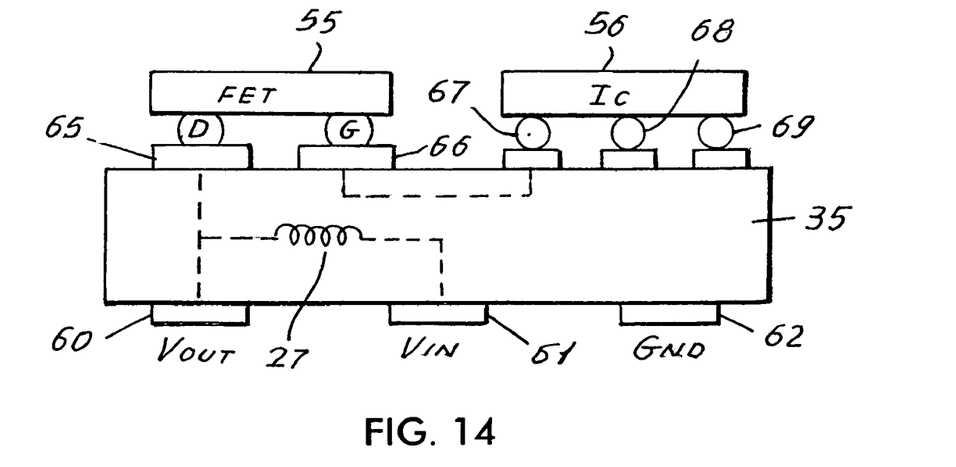
FIG. 14 shows an embodiment of the insulation in which components of FIG. 13 are added tot the embedded inductor structure.

In order to implement the circuit of FIG. 13, the structure of FIGS. 11 and 12 is modified to produce plural contact pads 60, 61, 62 on the bottom, defining terminals for $V_{OUT}$, $V_{IN}$ and ground and plural contact pads 65, 66, 67, 68, 69 on the top of insulation body 35. The MOSFET 55 of FIG. 13 has ball contacts as shown in FIG. 14 to make a drain and gate connection to pads 65 and 66 respectively (and a source ball, not shown in connected to another pad, not shown), while IC 65 has ball terminals connected to pads 67, 68 and 69.

The resistor 52 and capacitor 53 may also be connected to suitable terminal pads on insulation 35, or, if desired may be contained or embedded within insulation 35. All components are internally connected by plated-through contacts to define the circuit of FIG. 13. The entire assembly can then be mounted down to a support board with contact traces to receive pads 60, 61 and 62.

More specific examples of embedded inductors according to the present invention which exhibit improved inductance will now be described.

Table 1 lists the relevant properties of the permalloy compositions used in an inductor according to the present invention. A permalloy composition used in an inductor according to the present invention generally comprises pre-sintered ferrite particles in an epoxy binder. In the examples described herein, pre-sintered ferrite particles supplied by Steward and an epoxy binder supplied by Electra were used. The invention, however, is not limited to the specific examples of the constituents listed herein and it is to be understood that other pre-sintered ferrite particles and epoxy binders may also be used to compose a permalloy that can be used to form an inductor according to the present invention.

TABLE 2

| Test Inductor | Number of Coils | Track Width [mm] | Gap [mm] |
| --- | --- | --- | --- |
| 74 | 5 | 0.5 | 0.5 |
| 76 | 3 | 1.0 | 0.5 |
| 78 | 2 | 2.0 | 0.5 |
| 80 | 3 | 0.5 | 1.0 |
| 82 | 2 | 1.0 | 1.0 |
| 84 | 2 | 2.0 | 1.0 |

The following procedure was used to prepare the test inductors 74, 76, 78, 82, 84:
(1) Screen printing ferrite bottom layer through 46T mesh onto an FR4 substrate;
(2) 20 mins at 80° C. solvent dry off;
(3) screen printing silver loaded paste through 46T mesh;
(4) 20 mins at 80° C. solvent dry off;
(5) screen printing top ferrite layer through 46T mesh;
(6) 20 mins at 80° C. solvent dry off;
(7) 30 mins cure at 150° C.

The solvent dry off steps (Steps 2, 4, and 6) were included to improve interlayer adhesion. It has been observed that a small amount of mixing may occur at the interface of the spiral inductor 27 and the surrounding magnetically permeable ferrite paste (layers 70, 72).

The silver ink material used in the test inductors 74, 76, 78, 80, 82, 84 had a sheet resistivity of 20-25 milliohms/square. The meshes used to print both conductive inductors 27 and ferrite paste 70, 72 layers were 46T, emulsion thickness 20 µm. The individual layer thickness was expected to be in the region of 15 to 20 µm, and the workable screen print area was approximately 6" by 8".

TABLE 1

| | Material Composition | Particle size Fisher/Coulter [um] | Initial permeability ($\mu_o$) | Operating Frequency | Paste Details |
| --- | --- | --- | --- | --- | --- |
| 1 | NiZn Ferrite | 2.9/9.14 | 2700 | 1-100 MHz | Bis-phenyl-A with phenolic curing agent |
| 2 | MnZn Ferrite | 2.49/11.4 | 850 | <2 MHZ | Bis-phenyl-A with phenolic curing agent |
| 3 | MnZn Ferrite | N/A/47.39 | 850 | <2 MHZ | Bis-phenyl-A with phenolic curing agent |

Preferably, the epoxy binder may be loaded with as much pre-sintered ferrite particles as possible. It has been noted, however, that too high a loading results in "mesh marked coatings", which occurs when the material becomes fixatropic and does not flow between each printed mesh cell.

Figure 15:
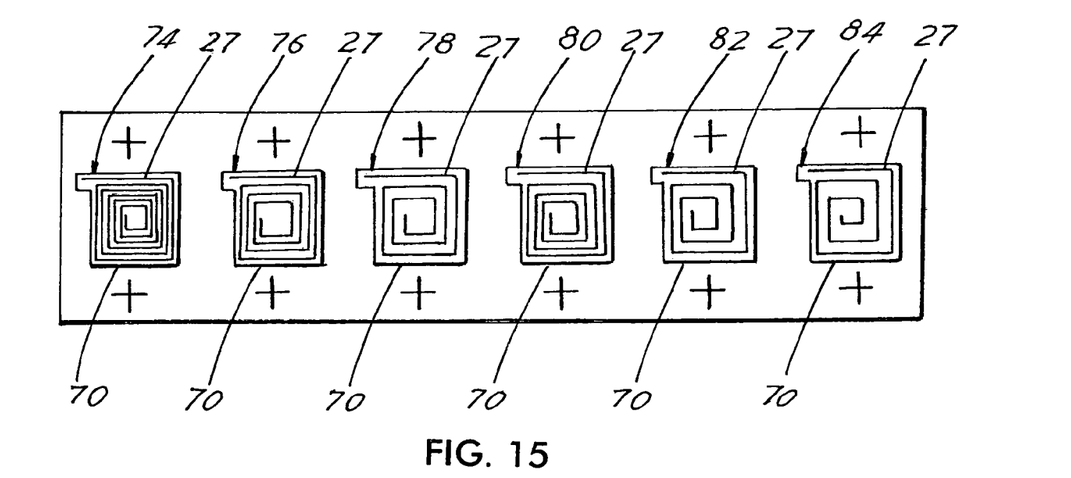
FIG. 15 is a top view of a plurality of test inductors according to the present invention each having a top portion thereof removed for illustrative purposes.
Figure 16:
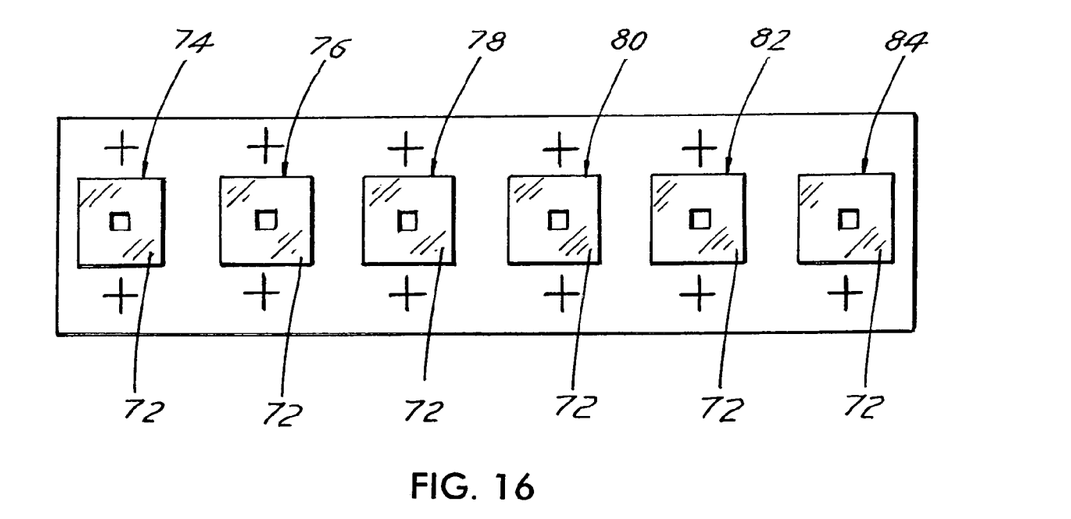
FIG. 16 is a top view of a plurality of test inductors according to the present invention.

FIGS. 15 and 16 show test inductors 74, 76, 78, 80, 82, 84. Each test inductor 74, 76, 78, 80, 82, 84 comprises a ferrite loaded paste area 70 onto which a silver loaded epoxy paste spiral inductor 27 is printed by, for example, screen printing. A second layer of ferrite paste 72 is then deposited onto the stack to encapsulate spiral inductors 27. The second layer of ferrite paste 72 has a central opening into which contacts are made for electrical testing.

Table 2 lists the relevant parameters for each test inductor such as number of coils, track and gap spacing etc. Each test inductor 74, 76, 78, 80, 82, 84 was designed to occupy an area of 15 mm×15 mm excluding contact areas. Contact areas were kept to 2.5×2.5 mm to enable hand testing.

Once the test inductors 74, 76, 78, 80, 82, 84 were formed, inductance and series resistance measurements were performed at 100 KHz, 1V using a HP4284A precision LCR meter. Care was taken to zero out stray test lead inductance and resistance prior to performing the measurements.

Figure 17:
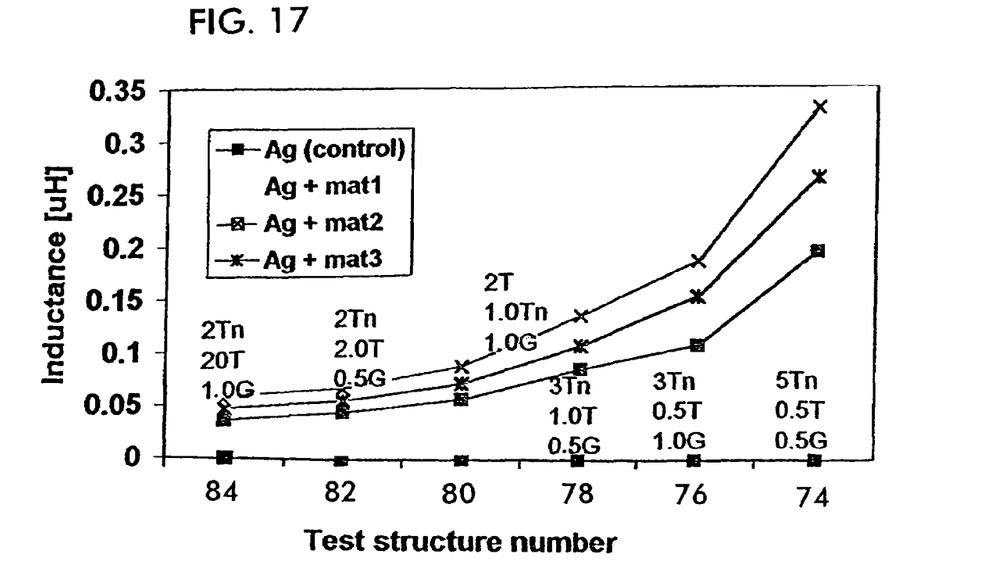
FIG. 17 graphically shows the experimentally obtained inductance values for the test inductors.

FIG. 17 shows a plot of inductance versus test structure number for each material set used, where Tn=turns, G=gap in mm, T=track width in mm. The control was generated from a spiral coil printed down upon an FR4 substrate with no surrounding ferrite layers. Referring to FIG. 17, each of the test inductors 74, 76, 78, 80, 82, 84 shows an increased inductance value in comparison with the control. The obtained values varied between 34 and 330 nH.

Figure 18:
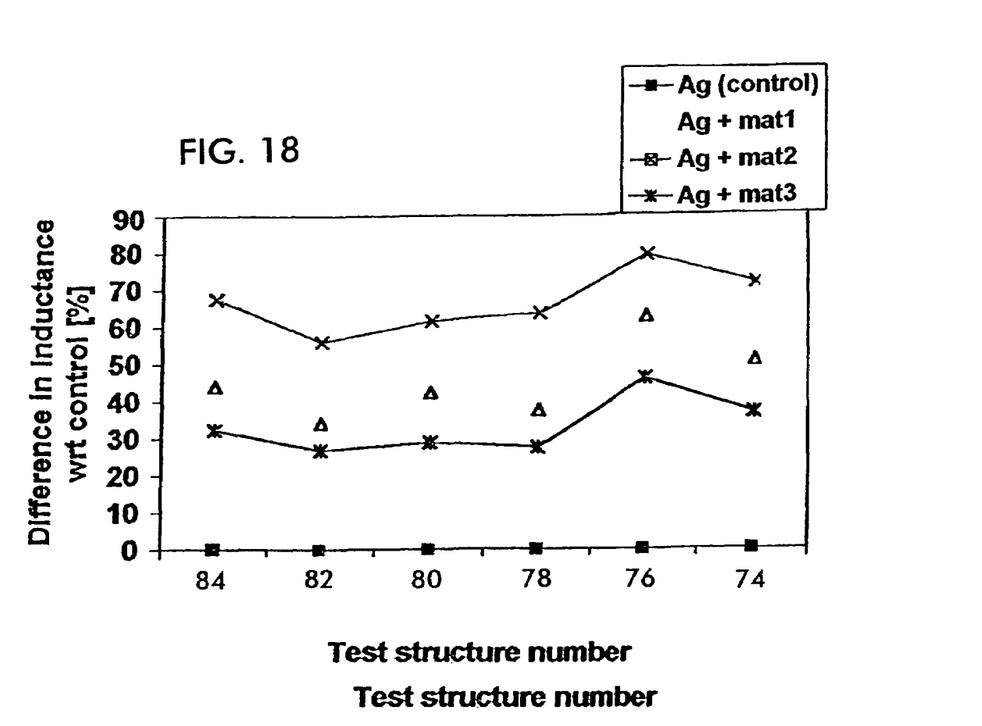
FIG. 18 provides a graphical comparison between the inductance of the test inductors according to the present invention and that of a control inductor.

FIG. 18 shows the percentage difference in inductance for a given test inductor 74, 76, 78, 80, 82, 84 over the control for the various ferrite loaded epoxies. 30% to 80% improvement in inductance over the control sample is recorded for the spiral inductors 27 surrounded by ferrite paste; i.e. the test inductors 74, 76, 78, 80, 82, 84. The increase in inductance averaged across each test inductor 74, 76, 78, 80, 82, 84 for each type of ferrite is listed in table 3.

TABLE 3

| Material | Filler composition (particle size coulter) | Permeability [value in sintered Ferrite core] | Average increase in inductance w.r.t. control coil @100 kHz [%] |
| --- | --- | --- | --- |
| 2 | NiZn (11 μm) | 850 | +66.7% |
| 1 | MnZn (9 μm) | 2700 | +45.3% |
| 3 | NiZn (46 μm) | 850 | +33.1% |

The highest average increase in inductance was recorded from samples embedded in Ni—Zn alloy impregnated materials with 11 μm particle size. It is noteworthy that surprisingly Ni—Zn does not have the highest permeability in sintered cores. It is believed that the high inductance for the Ni—Zn alloy may be effected by both loading content and frequency of measurement.

Figure 19:
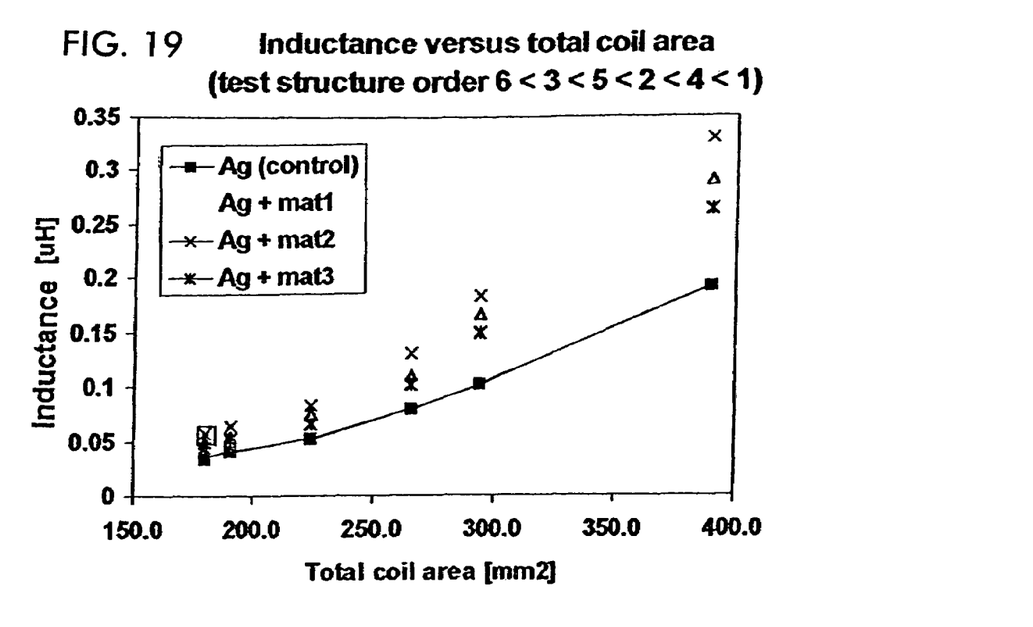
FIG. 19 graphically illustrates the relationship between inductance and total area of the inductive element in the test inductors.

The relationship between inductor value and effective coil area is illustrated by FIG. 19. The effective coil area is the sum of the individual coil areas that form the spiral inductor. FIG. 19 shows a nonlinear relationship with area for each set of test inductors 74, 76, 78, 80, 82, 84, although the general trend is that inductance increases with area.

Figure 20:
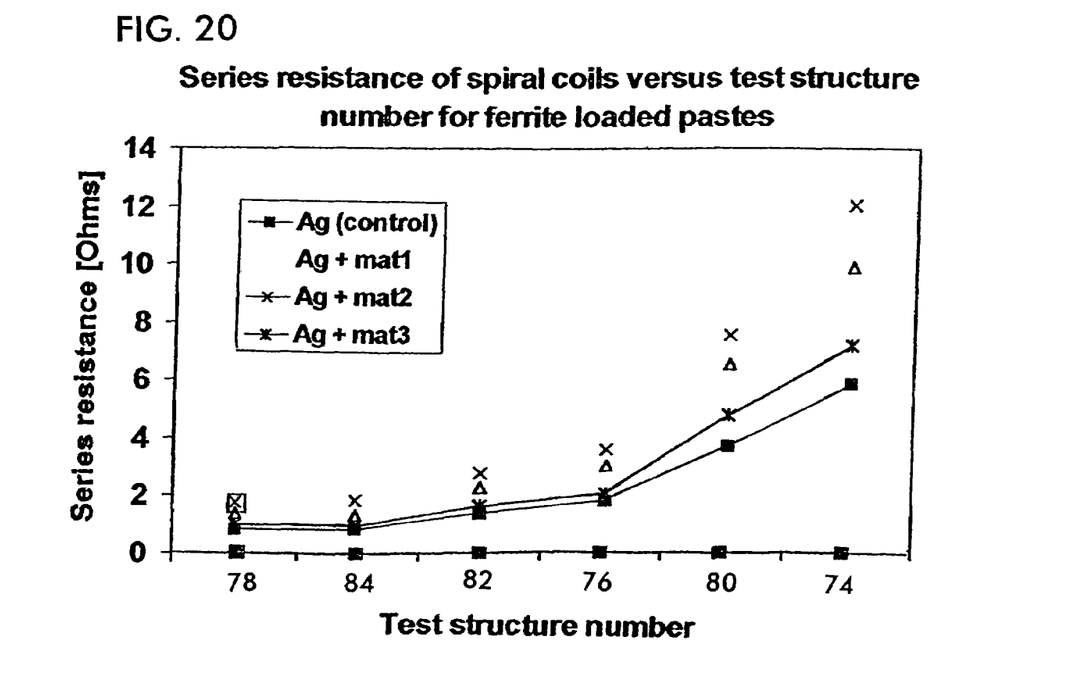
FIG. 20 graphically shows the series resistance values for the test inductors according to the present invention.

FIG. 20 shows the series resistance of the test inductors 74, 76, 78, 80, 82, 84. In FIG. 20, the test structure numbers have been ordered in terms of increasing resistance. Surprisingly, the series resistance of the test inductors 74, 76, 78, 80, 82, 84 varies with the material surrounding the spiral inductor 27. This may arise from interfacial mixing of the epoxy and ferrite pastes during the dry/cure stages, which may be avoided, if desired, by fully curing each layer prior to additional layer build up.

The values of resistance obtained are in the regions of 1 to 12 Ohms. Using plated and etched copper spiral inductors would exhibit lower resistance. Spiral inductors produced using copper tracks of 1-2 Oz thickness should reduce the resistance by factors of 50 to 100. This would result in spiral inductors 27 having 10 to 120 mOhms. Resistance may be further reduced as the permeability of the surrounding material is improved to enable shrinkage of the coils.

As illustrated by the examples, embedding spiral inductors in pre-sintered ferrite loaded epoxy pastes significantly increases the value of inductance. For example, increases in inductance of over 75% have been noted using MnZn loaded materials measured at 100 kHz. Also, the examples illustrate that different MnZn filler particle sizes have an effect on inductance. For example, an inductance value of 0.33 μH was obtained from a 5 spiral structure embedded in MnZn ferrite impregnated epoxy.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A circuit board comprising:
   an insulation body;
   at least two conductive pads;
   a spiral inductor, said inductor including at least two terminals each being electrically connected to a respective conductive pad; and
   a magnetically permeable body disposed around said spiral inductor and embedded in said insulation body.

2. The circuit board of claim 1, wherein said magnetically permeable body includes particles of a pre-sintered magnetically permeable material in a resin binder.

3. The circuit board of claim 2, wherein said particles are comprised of permalloy.

4. The circuit board of claim 1, wherein said inductor is comprised of copper.

5. The circuit board of claim 1, wherein said inductor is comprised of electrically conductive epoxy.

6. The circuit board of claim 5, wherein said electrically conductive epoxy includes silver particles.

7. The circuit board of claim 1, wherein said magnetically permeable body comprises NiZn Ferrite.

8. The circuit board of claim 1, wherein said magnetically permeable body comprises MnZn Ferrite.

9. The circuit board of claim 1, further comprising an insulated printed circuit board, wherein said magnetically permeable body is disposed over a surface of said insulated printed circuit board.

10. The circuit board of claim 1, wherein said conductive pads are disposed over either said insulation body or said insulated printed circuit board and each connected electrically to a respective terminal through a via.

11. The circuit board of claim 1, wherein said magnetically permeable body is ferromagnetic.

12. The circuit board of claim 1, wherein said pre-sintered magnetically permeable material is a soft ferrite.

* * * * *